United States Patent
Guo et al.

(10) Patent No.: US 8,496,843 B2
(45) Date of Patent: *Jul. 30, 2013

(54) METHOD OF POLISHING A SUBSTRATE COMPRISING POLYSILICON AND AT LEAST ONE OF SILICON OXIDE AND SILICON NITRIDE

(75) Inventors: Yi Guo, Newark, DE (US); Zhendong Liu, King of Prussia, PA (US); Kancharla-Arun Kumar Reddy, Bear, DE (US); Guangyun Zhang, Furlong, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 442 days.

This patent is subject to a terminal disclaimer.

(21) Appl. No.: 12/724,990

(22) Filed: Mar. 16, 2010

(65) Prior Publication Data
US 2011/0230050 A1  Sep. 22, 2011

(51) Int. Cl.
C03C 15/00 (2006.01)
C03C 25/68 (2006.01)
H01L 21/302 (2006.01)
H01L 21/461 (2006.01)

(52) U.S. Cl.
USPC ............. 216/89; 216/88; 216/90; 438/690; 438/691; 438/692

(58) Field of Classification Search
USPC ............... 216/88–90; 438/690–693
See application file for complete search history.

(56) References Cited

U.S. PATENT DOCUMENTS

| | | | |
|---|---|---|---|
| 3,457,107 A * | 7/1969 | Maisel et al. | 134/3 |
| 4,283,321 A | 8/1981 | Chakrabarti et al. | |
| 6,626,968 B2 * | 9/2003 | Park et al. | 51/309 |
| 6,743,683 B2 * | 6/2004 | Barns et al. | 438/299 |
| 7,247,566 B2 * | 7/2007 | Carter et al. | 438/692 |
| 2003/0228836 A1 * | 12/2003 | Lombardo et al. | 451/533 |
| 2006/0131275 A1 | 6/2006 | Bian | |
| 2006/0189126 A1 * | 8/2006 | Jang et al. | 438/629 |
| 2007/0077865 A1 | 4/2007 | Dysard et al. | |
| 2009/0298290 A1 * | 12/2009 | Kamimura | 438/693 |
| 2010/0009538 A1 * | 1/2010 | Kamimura | 438/692 |
| 2010/0279507 A1 * | 11/2010 | Guo et al. | 438/693 |
| 2011/0230048 A1 * | 9/2011 | Guo et al. | 438/693 |
| 2011/0230049 A1 * | 9/2011 | Guo et al. | 438/693 |

* cited by examiner

Primary Examiner — Allan Olsen
Assistant Examiner — Margaret D Klunk
(74) Attorney, Agent, or Firm — Thomas S. Deibert

(57) ABSTRACT

A method for chemical mechanical polishing of a substrate is provided, comprising: providing a substrate, wherein the substrate comprises polysilicon and at least one of silicon oxide and silicon nitride; providing a chemical mechanical polishing composition, comprising, as initial components: water; an abrasive; and an alkyl aryl polyether sulfonate compound, wherein the alkyl aryl polyether sulfonate compound has a hydrophobic portion having an alkyl group bound to an aryl ring and a nonionic acyclic hydrophilic portion having 4 to 100 carbon atoms; providing a chemical mechanical polishing pad with a polishing surface; moving the polishing surface relative to the substrate; dispensing the chemical mechanical polishing composition onto the polishing surface; and, abrading at least a portion of the substrate to polish the substrate; wherein at least some of the polysilicon is removed from the substrate; and, wherein at least some of the at least one of silicon oxide and silicon nitride is removed from the substrate.

18 Claims, No Drawings

METHOD OF POLISHING A SUBSTRATE COMPRISING POLYSILICON AND AT LEAST ONE OF SILICON OXIDE AND SILICON NITRIDE

The present invention relates to chemical mechanical polishing compositions and methods of using the same. More particularly, the present invention relates to chemical mechanical polishing compositions for polishing a substrate having polysilicon in the presence of at least one of silicon oxide and silicon nitride.

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes nonplanar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

One method used for isolating elements of a semiconductor device, referred to a shallow trench isolation (STI) process, conventionally involved use of a silicon nitride layer formed on a silicon substrate, shallow trenches formed in the silicon nitride layer and a dielectric material (e.g., an oxide) is deposited to fill the trenches. Typically an excess of dielectric material is deposited on top of the substrate to ensure complete filling of the trenches. The excess dielectric material layer is then removed to expose the silicon nitride layer using chemical mechanical planarization techniques.

Past device designs emphasized chemical mechanical planarization selectivity for silicon oxide versus silicon nitride (i.e., higher removal rate for silicon nitride relative to removal rate of silicon nitride). In these device designs, the silicon nitride layer served as a stopping layer for the chemical mechanical planarization process.

Certain recent device designs demand polishing compositions that provide selectivity for at least one of silicon oxide and silicon nitride in preference to polysilicon (i.e., higher removal rate for at least one of silicon oxide and silicon nitride relative to the removal rate for polysilicon) for use in chemical mechanical planarization processes.

One polishing formulation for use in a chemical mechanical planarization process that provides selectivity for at least one of silicon oxide and silicon nitride relative to polysilicon is disclosed in U.S. Patent Application Publication No. 2007/0077865 to Dysard, et al. Dysard, et al. discloses a method of chemically mechanically polishing a substrate, which method comprises: (i) contacting a substrate comprising polysilicon and a material selected from silicon oxide and silicon nitride with a chemical mechanical polishing system comprising: (a) an abrasive, (b) a liquid carrier, (c) about 1 ppm to about 100 ppm, based on the weight of the liquid carrier and any components dissolved or suspended therein, of a polyethylene oxide/polypropylene oxide copolymer having an HLB of about 15 or less, and (d) a polishing pad, (ii) moving the polishing pad relative to the substrate, and (iii) abrading at least a portion of the substrate to polish the substrate.

Another polishing formulation for use in a chemical mechanical planarization process that provides selectivity for at least one of silicon oxide and silicon nitride relative to polysilicon is disclosed in U.S. Pat. No. 6,626,968 to Park, et al. Park, et al. disclose a chemical mechanical polishing composition in slurry form having a pH of 7 to 11 for simultaneously polishing a surface having a silicon oxide layer and a polysilicon layer, said slurry composition consisting essentially of water, abrasive grains selected from the group consisting of silica ($SiO_2$), alumina ($Al_2O_3$), ceria ($CeO_2$), magania ($Mn_2O_3$), and mixtures thereof, and about 0.001% to about 5% by weight of a polymer additive selected from the group consisting of poly vinyl methyl ether (PVME), poly ethylene glycol (PEG), poly oxyethylene 23 lauryl ether (POLE), poly propanoic acid (PPA), poly acrylic acid (PAA), poly ether glycol bis ether (PEGBE), and mixtures thereof wherein the polymer additive improves the selectivity ratio for removal of silicon oxide layer relative to removal of the polysilicon layer.

Notwithstanding, to support the dynamic field of device designs for use in the manufacture of semiconductor systems there exists a continued need for chemical mechanical polishing compositions formulated to provide a desirable balance of polishing properties to suit changing design needs. For example, there remains a need for chemical mechanical polishing compositions that exhibit a tailored removal rate and removal rate selectivity that favors the removal of at least one of silicon nitride and silicon oxide relative to polysilicon.

The present invention provides a method for chemical mechanical polishing of a substrate, comprising: providing a substrate, wherein the substrate comprises polysilicon and at least one of silicon oxide and silicon nitride; providing a chemical mechanical polishing composition, comprising (preferably consisting essentially of), as initial components: water; an abrasive; and an alkyl aryl polyether sulfonate compound, wherein the alkyl aryl polyether sulfonate compound has a hydrophobic portion having an alkyl group bound to an aryl ring and a nonionic acyclic hydrophilic portion having 4 to 100 carbon atoms; providing a chemical mechanical polishing pad with a polishing surface; moving the polishing surface relative to the substrate; dispensing the chemical mechanical polishing composition onto the polishing surface; and, abrading at least a portion of the substrate to polish the substrate; wherein at least some of the polysilicon is removed from the substrate; and, wherein at least some of the at least one of silicon oxide and silicon nitride is removed from the substrate.

The present invention also provides a method for chemical mechanical polishing of a substrate, comprising: providing a substrate, wherein the substrate comprises polysilicon and at least one of silicon oxide and silicon nitride; providing a chemical mechanical polishing composition, comprising (preferably consisting essentially of), as initial components:

water; an abrasive; and an alkyl aryl polyether sulfonate compound, wherein the alkyl aryl polyether sulfonate compound has a hydrophobic portion having an alkyl group bound to an aryl ring and a nonionic acyclic hydrophilic portion having 4 to 100 carbon atoms; providing a chemical mechanical polishing pad with a polishing surface; moving the polishing surface relative to the substrate; dispensing the chemical mechanical polishing composition onto the polishing surface; and, abrading at least a portion of the substrate to polish the substrate; wherein at least some of the polysilicon is removed from the substrate; wherein at least some of the at least one of silicon oxide and silicon nitride is removed from the substrate; and, wherein the chemical mechanical polishing composition exhibits a polishing pH of 2 to 5.

The present invention further provides a method for chemical mechanical polishing of a substrate, comprising: providing a substrate, wherein the substrate comprises polysilicon and at least one of silicon oxide and silicon nitride; providing a chemical mechanical polishing composition, comprising (preferably consisting essentially of), as initial components: water; an abrasive; and an alkyl aryl polyether sulfonate compound, wherein the alkyl aryl polyether sulfonate compound has a formula

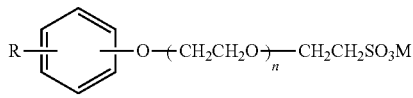

wherein R is a branched $C_{6-10}$ alkyl group; n is 2 to 8; and, M is selected from the group consisting of H, Na, K, $L_1$ and $NH_4$; providing a chemical mechanical polishing pad with a polishing surface; moving the polishing surface relative to the substrate; dispensing the chemical mechanical polishing composition onto the polishing surface; and, abrading at least a portion of the substrate to polish the substrate; wherein at least some of the polysilicon is removed from the substrate; wherein at least some of the at least one of silicon oxide and silicon nitride is removed from the substrate; and, wherein the chemical mechanical polishing composition exhibits a polishing pH of 2 to 5 adjusted with an inorganic acid.

DETAILED DESCRIPTION

The chemical mechanical polishing method of the present invention is useful for polishing a substrate comprising polysilicon in combination with at least one of silicon oxide and silicon nitride. The chemical mechanical polishing composition used in the method of the present invention contains a polysilicon removal rate suppressing amount of an alkyl aryl polyether sulfonate compound which has a reduced effect on the removal rate of at least one of silicon oxide and silicon nitride.

The term "substantially lower" used herein and in the appended claims regarding the removal rate suppression of polysilicon (for removal rate measured in Å/min) resulting from the addition of an alkyl aryl polyether sulfonate compound to the chemical mechanical polishing composition means that the removal rate of polysilicon is ≧50% lower. That is, the following expression will be satisfied when the polysilicon removal rate is substantially lower:

$((A_0-A)/A_0)*100 \geq 50$ wherein A is the polysilicon removal rate in Å/min for a chemical mechanical polishing composition used in the method of the present invention containing an alkyl aryl polyether sulfonate compound; $A_0$ is the polysilicon removal rate in Å/min obtained under identical conditions except that the alkyl aryl polyether sulfonate compound is absent from the chemical mechanical polishing composition.

The alkyl aryl polyether sulfonate compound used in the chemical mechanical polishing composition used in the chemical mechanical polishing method of the present invention can be represented by the general formula R—$SO_3H$ or as a salt, R—$SO_3^-$, wherein R comprises a hydrophobic portion and a nonionic acyclic hydrophilic portion. The sulfonic acid moiety (i.e., —$SO_3H$) and the sulfonate moiety (—$SO_3^-$) are used interchangeably herein.

The hydrophobic portion in the alkyl aryl polyether sulfonate compound comprises an alkyl group bound to an aryl ring. In particular, the hydrophobic portion comprises an alkyl group having 4 to 24 carbon atoms bound to an aryl ring, preferably a benzene ring. Preferably, the hydrophobic portion comprises an alkyl group having 4 to 15 carbon atoms bound to a benzene ring. More preferably, the hydrophobic portion comprises an alkyl group having 6 to 10 carbon atoms bound to a benzene ring. The alkyl group bound to the aryl ring can be either a straight chain or branched chain. The alkyl group bound to the aryl ring can be saturated or unsaturated. Most preferably, the alkyl group bound to the aryl ring is a branched chain, saturated alkyl group having 6 to 10 carbon atoms.

The nonionic acyclic hydrophilic portion in the alkyl aryl polyether sulfonate compound contains 4 to 100 carbon atoms. Preferably, the nonionic acyclic hydrophilic portion contains 6 to 50 carbon atoms. Still more preferably, the nonionic acyclic hydrophilic portion contains 6 to 20 carbon atoms. The nonionic acyclic hydrophilic portion can be either a straight chain or branched chain. The nonionic acyclic hydrophilic portion can be saturated or unsaturated. Preferably, the nonionic acyclic hydrophilic portion is a saturated or unsaturated, straight chain of polyalkylene oxide. Most preferably, the nonionic acyclic hydrophilic portion is a straight chain of polyethylene oxide.

The alkyl aryl polyether sulfonate compound is optionally added to the chemical mechanical polishing composition used in the method of the present invention, as an ammonium, potassium, quaternary ammonium, sodium or lithium salt. Preferably, the alkyl aryl polyether sulfonate compound is added to the chemical mechanical polishing composition used in the method of the present invention as a sodium salt.

Preferably, the alkyl aryl polyether sulfonate compound has a formula

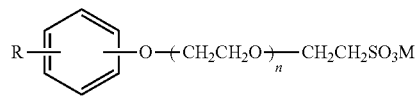

wherein R is a branched $C_{6-10}$ alkyl group; n is 2 to 8; and M is selected from the group consisting of H, Na, K, Li and $NH_4$ (more preferably H and Na; most preferably M is Na).

The amount of alkyl aryl polyether sulfonate compound used in the chemical mechanical polishing composition used in the chemical mechanical polishing method of the present invention is selected to tailor the polysilicon removal rate relative to the removal rate of at least one of silicon oxide and silicon nitride. The chemical mechanical polishing composition used preferably contains, as an initial component, 0.0001 to 1 wt % of the alkyl aryl polyether sulfonate compound. More preferably, the chemical mechanical polishing composition used comprises, as an initial component, 0.01 to 1 wt %, still more preferably 0.01 to 0.1 wt %, most preferably 0.01 to 0.05 wt %, of the alkyl aryl polyether sulfonate compound.

The water contained in the chemical mechanical polishing composition used in the chemical mechanical polishing method of the present invention is preferably at least one of deionized and distilled to limit incidental impurities.

The chemical mechanical polishing composition used in the chemical mechanical polishing method of the present invention contains 0.1 to 40 wt % abrasive; preferably 5 to 25 wt % abrasive. The abrasive used preferably has an average particle size of ≦100 nm; more preferably 10 to 100 nm; most preferably 25 to 60 nm.

Abrasive suitable for use in the chemical mechanical polishing composition used in the chemical mechanical polishing method of the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, organic polymer-coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides.

The preferred abrasive for use in the chemical mechanical polishing composition used in the chemical mechanical polishing method of the present invention is colloidal silica. Preferably, the colloidal silica used contains at least one of fumed silica, precipitated silica and agglomerated silica. Preferably, the colloidal silica used has an average particle size of ≦100 nm, more preferably 10 to 100 nm, most preferably 25 to 60 nm; and accounts for 0.1 to 40 wt %, preferably 1 to 30 wt %; most preferably 15 to 25 wt % of the chemical mechanical polishing composition.

The chemical mechanical polishing composition used in the chemical mechanical polishing method of the present invention optionally further comprises additional additives selected from dispersants, surfactants, buffers, anti-foaming agents and biocides.

The chemical mechanical polishing composition used in the chemical mechanical polishing method of the present invention has a pH of ≦5, preferably 2 to 4, more preferably 2 to 3. The chemical mechanical polishing composition used can include inorganic and organic pH adjusting agent. Optionally, the pH adjusting agent is selected from an inorganic acid (e.g., nitric acid, sulfuric acid, hydrochloric acid and phosphoric acid).

The substrate polished in the chemical mechanical polishing method of the present invention comprises polysilicon in combination with at least one of silicon oxide and silicon nitride.

The polysilicon in the substrate can be any suitable polysilicon material known in the art. The polysilicon can be in any suitable phase, and can be amorphous, crystalline or a combination thereof.

The silicon oxide in the substrate, if present, can be any suitable silicon oxide material known in the art; for example, borophosphosilicate glass (BPSG), plasma-etched tetraethyl ortho silicate (PETEOS), thermal oxide, undoped silicate glass, high density plasma (HDP) oxide.

The silicon nitride in the substrate, if present, can be any suitable silicon nitride material known in the art; for example, $Si_3N_4$.

The chemical mechanical polishing pad used in the chemical mechanical polishing method of the present invention can by any suitable polishing pad known in the art. The chemical mechanical polishing pad may optionally be selected from woven and non-woven polishing pads. The chemical mechanical polishing pad can be made of any suitable polymer of varying density, hardness, thickness, compressibility and modulus. The chemical mechanical polishing pad can be grooved and perforated as desired.

The alkyl aryl polyether sulfonate compound contained in the chemical mechanical polishing composition used in the chemical mechanical polishing method of the present invention preferably suppresses the removal rate of polysilicon (as measured in angstroms per minute, Å/min) in a greater differential rate than it suppresses the removal rate of at least one of silicon oxide and silicon nitride. If we define the relative suppression ($\Delta X$) of removal rate of a film X as $\Delta X=(X_0-X)/X_0$, wherein $X_0$ and X stand for the removal rates of film X, measured in Å/min using a polishing composition without ($X_0$) and with (X) the addition of an alkyl aryl polyether sulfonate compound. Inclusion of an alkyl aryl polyether sulfonate compound in the chemical mechanical polishing composition used in the method of the present invention preferably satisfies at least one of the following equations (i) $\Delta$polysilicon>$\Delta$Silicon oxide and (ii) $\Delta$polysilicon>$\Delta Si_3N_4$, as measured under the polishing conditions set forth in the Examples. For example, if polishing under the conditions set forth in the Examples with an alkyl aryl polyether sulfonate compound free composition provides a control removal rate $X_0$=500 Å/min for polysilicon and 500 Å/min for silicon dioxide and silicon nitride; and adding an alkyl aryl polyether sulfonate compound to the polishing composition reduces the removal rate of polysilicon to X=300 Å/min, then the removal rate of at least one of silicon dioxide and silicon nitride must be >300 Å/min.

Desirably, in the chemical mechanical polishing method of the present invention, the polishing removal rate of polysilicon exhibited by the chemical mechanical polishing composition comprising an alkyl aryl polyether sulfonate compound is substantially lower than the removal rate of the polysilicon obtained under the same conditions except for the absence of the alkyl aryl polyether sulfonate compound. Preferably, polysilicon removal rate suppression obtained through addition of the alkyl aryl polyether sulfonate compound to the chemical mechanical polishing composition used in the method of the present invention is 50%; more preferably ≧60%; most preferably ≧70% (i.e., removal rate suppression=$((A_0-A)/A_0)^*100$)), as measured under the polishing conditions set forth in the Examples. Typically, the polysilicon removal rate suppression obtained through the addition of the alkyl aryl polyether sulfonate compound to the chemical mechanical polishing composition used in the method of the present invention is ≦200%.

Desirably, the chemical mechanical polishing composition used in the chemical mechanical polishing method of the present invention exhibits a polishing removal rate suppression for polysilicon of ≧50%, more preferably ≧60% most preferably ≧70% (i.e., removal rate suppression=$((A_0-A)/A_0)^*100$)), as measured under the polishing conditions set forth in the Examples; and exhibits a polishing removal rate change for at least one of silicon oxide and silicon nitride <50%; more preferably ≦25% (i.e., removal rate change= ((absolute value of $(B_0-B))/B_0)^*100$, wherein B is the silicon oxide or silicon nitride removal rate in Å/min for a chemical mechanical polishing composition used in the method of the present invention containing an alkyl aryl polyether sulfonate compound; $B_0$ is the silicon oxide or silicon nitride removal rate obtained under identical conditions except that the alkyl aryl polyether sulfonate compound is absent from the chemical mechanical polishing composition), as measured under the polishing conditions set forth in the Examples.

Desirably, the chemical mechanical polishing method of the present invention can be used to polish a substrate with a silicon nitride removal rate of $\geq 500$ Å/min, preferably $\geq 800$ Å/min, more preferably $\geq 1,000$ Å/min, most preferably $\geq 1,200$ Å/min, as measured under the polishing conditions set forth in the Examples; a silicon nitride to amorphous polysilicon polishing selectivity of $\geq 5:1$, preferably $\geq 6:1$, more preferably $\geq 8:1$ (i.e., removal rate of silicon nitride: removal rate of amorphous polysilicon), as measured under the polishing conditions set forth in the Examples; and a silicon nitride to crystalline polysilicon removal rate selectivity of $\geq 10:1$; preferably $\geq 15:1$; more preferably $\geq 20:1$ (i.e., removal rate of silicon nitride:removal rate of crystalline polysilicon), as measured under the polishing conditions set forth in the Examples.

Desirably, the chemical mechanical polishing method of the present invention can be used to polish a substrate with a silicon oxide removal rate of $\geq 500$ Å/min, preferably $\geq 800$ Å/min, more preferably $\geq 1,000$ Å/min, as measured under the polishing conditions set forth in the Examples; a silicon oxide to amorphous polysilicon removal rate selectivity of $\geq 5:1$, preferably $\geq 6:1$, more preferably $\geq 7:1$ (i.e., removal rate of silicon oxide:removal rate of amorphous polysilicon), as measured under the polishing conditions set forth in the Examples; and, a silicon oxide to crystalline polysilicon removal rate selectivity of $\geq 10:1$; preferably $\geq 15:1$; more preferably $\geq 18:1$ (i.e., removal rate of silicon oxide:removal rate of crystalline polysilicon), as measured under the polishing conditions set forth in the Examples.

Desirably, the chemical mechanical polishing method of the present invention simultaneously provides selective polishing (i.e., removal) of both silicon oxide and silicon nitride relative to polysilicon (i.e., exhibits a higher removal rate for both silicon oxide and silicon nitride relative to the removal rate for polysilicon, as measured under the polishing conditions set forth in the Examples).

The chemical mechanical polishing composition used in the chemical mechanical polishing method of the present invention enables operation with a low nominal polishing pad pressure, for example at 3 to 35 kPa. The low nominal polishing pad pressure improves polishing performance by reducing scratching and other undesired polish defects and minimizes damage to fragile materials.

Some embodiments of the present invention will now be described in detail in the following Examples.

Example 1

Chemical Mechanical Polishing Compositions

The chemical mechanical polishing compositions (CMPC's) tested are described in Table 1. The chemical mechanical polishing composition A is a comparative formulation, which is not within the scope of the claimed invention.

TABLE 1

| CMPC | Alkyl aryl polyether sulfonate compound[τ] (wt %) | Abrasive[£] (wt %) | Final pH[¥] |
|---|---|---|---|
| A | — | 12 | 2.5 |
| 1 | 0.03 | 12 | 2.5 |
| 2 | 0.05 | 12 | 2.5 |

[τ]the alkyl aryl polyether sulfonate compound used in the Examples was according to the formula

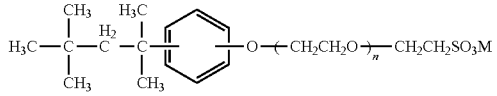

wherein n is 2; and M is Na (specifically Triton® X200 available from The Dow Chemical Company).
[£]the abrasive used in the Examples was Klebosol® PL1598B25 colloidal silica manufactured by AZ Electronic Materials and available from The Dow Chemical Company.
[¥]the composition pH was adjusted as necessary using $HNO_3$ or KOH.

Example 2

Polishing Tests

The chemical mechanical polishing compositions described in Table 1 were tested using 200 mm blanket wafers, specifically (A) TEOS dielectric wafers; (B) $Si_3N_4$ dielectric wafers and (C) amorphous polysilicon dielectric wafers and (D) crystalline polysilicon dielectric wafers. An Applied Materials Mirra® CMP polishing platform was used to polish all of the blanket wafers in the Examples using a polishing pad comprising a polyurethane polishing layer containing polymeric hollow core microparticles and a polyurethane impregnated non-woven subpad (namely an ICI010™ polishing pad commercially available from Rohm and Haas Electronic Materials CMP Inc.). The polishing conditions used in all of the Examples included a platen speed of 93 rpm; a carrier speed of 87 rpm; with a polishing medium flow rate of 200 ml/min and a downforce of 20.7 kPa. Removal rates for each of the polish experiments are provided in Table 2. Note that the removal rates were calculated from the before and after polish film thickness. Specifically, the removal rates were determined using a SpectraFX 200 optical thin-film metrology system available from KLA-Tencor.

TABLE 2

| CMPC | TEOS removal rate (Å/min) | $Si_3N_4$ (Å/min) | Amorphous polysilicon (Å/min) | Crystalline polysilicon (Å/min) |
|---|---|---|---|---|
| A | 1296 | 1412 | 649 | 223 |
| 1 | 1045 | 1404 | 167 | 58 |
| 2 | 1020 | 651 | 129 | 54 |

We claim:

1. A method for chemical mechanical polishing of a substrate, comprising:
providing a substrate, wherein the substrate comprises polysilicon and at least one of silicon oxide and silicon nitride;
providing a chemical mechanical polishing composition, consisting of, as initial components: water; an abrasive; an alkyl aryl polyether sulfonate compound, wherein the alkyl aryl polyether sulfonate compound has a formula

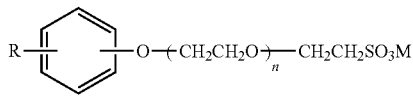

wherein R is a branched $C_{6-10}$ alkyl group; n is 2 to 8; and, M is selected from the group consisting of H, Na, K, $L_1$ and $NH_4$; and, optionally, a pH adjusting agent, wherein the pH adjusting agent is an inorganic acid;
providing a chemical mechanical polishing pad with a polishing surface;
moving the polishing surface relative to the substrate;
dispensing the chemical mechanical polishing composition onto the polishing surface; and,
abrading at least a portion of the substrate to polish the substrate;
wherein at least some of the polysilicon is removed from the substrate; wherein at least some of the at least one of silicon oxide and silicon nitride is removed from the substrate; and, wherein the alkyl aryl polyether sulfonate compound suppresses the removal rate of polysilicon.

2. The method of claim 1, wherein the substrate comprises polysilicon in the presence of silicon oxide and wherein the chemical mechanical polishing composition exhibits a silicon oxide to polysilicon removal rate selectivity of >5:1.

3. The method of claim 2, wherein the chemical mechanical polishing composition exhibits a silicon oxide removal rate of >500 Å/min with a platen speed of 93 revolutions per minute, a carrier speed of 87 revolutions per minute, a chemical mechanical polishing composition flow rate of 200 ml/min, a nominal down force of 3 psi on a 200 mm polishing machine; and, wherein the chemical mechanical polishing pad comprises a polyurethane polishing layer containing polymeric hollow core microparticles and a polyurethane impregnated non-woven subpad.

4. The method of claim 3, wherein the polysilicon is amorphous polysilicon and wherein the chemical mechanical polishing composition exhibits a silicon oxide to amorphous polysilicon removal rate selectivity of >5:1.

5. The method of claim 3, wherein the polysilicon is crystalline polysilicon and wherein the chemical mechanical polishing composition exhibits a silicon oxide to crystalline polysilicon removal rate selectivity of >10:1.

6. The method of claim 1, wherein the substrate comprises polysilicon in the presence of silicon nitride and wherein the chemical mechanical polishing composition exhibits a silicon nitride to polysilicon removal rate selectivity of >5:1.

7. The method of claim 6, wherein the chemical mechanical polishing composition exhibits a silicon nitride removal rate of >500 Å/min with a platen speed of 93 revolutions per minute, a carrier speed of 87 revolutions per minute, a chemical mechanical polishing composition flow rate of 200 ml/min, a nominal down force of 3 psi on a 200 mm polishing machine; and, wherein the chemical mechanical polishing pad comprises a polyurethane polishing layer containing polymeric hollow core microparticles and a polyurethane impregnated non-woven subpad.

8. The method of claim 7, wherein the polysilicon is amorphous polysilicon and wherein the chemical mechanical polishing composition exhibits a silicon nitride to amorphous polysilicon removal rate selectivity of >5:1.

9. The method of claim 7, wherein the polysilicon is crystalline polysilicon and wherein the chemical mechanical polishing composition exhibits a silicon nitride to crystalline polysilicon removal rate selectivity of ≧10:1.

10. The method of claim 1, wherein the chemical mechanical polishing composition consists of as initial components: water; 0.1 to 40 wt % of the abrasive, wherein the abrasive is a colloidal silica abrasive; 0.01 to 1 wt % of the alkyl aryl polyether sulfonate compound; and, optionally, the pH adjusting agent.

11. The method of claim 10, wherein the substrate comprises polysilicon in the presence of silicon oxide and wherein the chemical mechanical polishing composition exhibits a silicon oxide to polysilicon removal rate selectivity of >5:1.

12. The method of claim 11, wherein the chemical mechanical polishing composition exhibits a silicon oxide removal rate of 500 Å/min with a platen speed of 93 revolutions per minute, a carrier speed of 87 revolutions per minute, a chemical mechanical polishing composition flow rate of 200 ml/min, a nominal down force of 3 psi on a 200 mm polishing machine; and, wherein the chemical mechanical polishing pad comprises a polyurethane polishing layer containing polymeric hollow core microparticles and a polyurethane impregnated non-woven subpad.

13. The method of claim 12, wherein the polysilicon is amorphous polysilicon and wherein the chemical mechanical polishing composition exhibits a silicon oxide to amorphous polysilicon removal rate selectivity of >5:1.

14. The method of claim 12, wherein the polysilicon is crystalline polysilicon and wherein the chemical mechanical polishing composition exhibits a silicon oxide to crystalline polysilicon removal rate selectivity of >10:1.

15. The method of claim 10, wherein the substrate comprises polysilicon in the presence of silicon nitride and wherein the chemical mechanical polishing composition exhibits a silicon nitride to polysilicon removal rate selectivity of >5:1.

16. The method of claim 15, wherein the chemical mechanical polishing composition exhibits a silicon nitride removal rate of >500 Å/min with a platen speed of 93 revolutions per minute, a carrier speed of 87 revolutions per minute, a chemical mechanical polishing composition flow rate of 200 ml/min, a nominal down force of 3 psi on a 200 mm polishing machine; and, wherein the chemical mechanical polishing pad comprises a polyurethane polishing layer containing polymeric hollow core microparticles and a polyurethane impregnated non-woven subpad.

17. The method of claim 16, wherein the polysilicon is amorphous polysilicon and wherein the chemical mechanical polishing composition exhibits a silicon nitride to amorphous polysilicon removal rate selectivity of >5:1.

18. The method of claim 16, wherein the polysilicon is crystalline polysilicon and wherein the chemical mechanical polishing composition exhibits a silicon nitride to crystalline polysilicon removal rate selectivity of ≧10:1.

* * * * *